United States Patent [19]

Frosien

[11] Patent Number: 4,926,054
[45] Date of Patent: May 15, 1990

[54] OBJECTIVE LENS FOR FOCUSING CHARGED PARTICLES IN AN ELECTRON MICROSCOPE

[75] Inventor: Juergen Frosien, Ottobrunn, Fed. Rep. of Germany

[73] Assignee: ICT Integrated Circuit Testing Gesellschaft für Halbleiterprüftechnik mbH, Fed. Rep. of Germany

[21] Appl. No.: 318,970

[22] Filed: Mar. 6, 1989

[30] Foreign Application Priority Data

Mar. 17, 1988 [DE] Fed. Rep. of Germany ....... 3809014

[51] Int. Cl.$^5$ .................... H01J 37/12; H01J 37/145; H01J 37/244
[52] U.S. Cl. ................. 250/396 R; 250/397; 250/310
[58] Field of Search ................ 250/310, 396 R, 397

[56] References Cited

U.S. PATENT DOCUMENTS 4,596,929 6/1986 Coates et al. .............. 250/310
4,831,266 5/1989 Frosien et al. ............. 250/297

OTHER PUBLICATIONS

Application Ser. No. 120,133, Ser. No. 030,964 and Ser. No. 150,245, (corresponding to U.S. Pat. Nos. 4,812,651, 4,785,176, and 4,896,036 respectively).

Primary Examiner—Jack I. Berman
Attorney, Agent, or Firm—Hill, Van Santen, Steadman & Simpson

[57] ABSTRACT

An objective lens which is a component of a scanning electron microscope and wherein the electron source or the intermediate image of the electron source is reduced by condenser lenses is imaged onto a specimen (PR). The objective lens comprises an asymmetrical magnetic lens (ML), an electrostatic immersion lens (OE/UE) superimposed on the magnetic lens (ML), and electrode (ST) which is connected to a variable potential ($U_{ST}$) so as to control the intensity of the current of secondary (SE) and back-scattered electrodes released from the specimen (PR), and a detector (DT) mounted immediately above the magnetic lens (ML). The electrodes (OE, UE) of the immersion lens are connected to potentials so that an electrical field which decelerates the primary electrons (PE) is formed inside the objective lens.

8 Claims, 2 Drawing Sheets

OBJECTIVE LENS FOR FOCUSING CHARGED PARTICLES IN AN ELECTRON MICROSCOPE

CROSS-REFERENCES TO RELATED APPLICATIONS

This Application is related to the following applications assigned to the assignee of the present application. U.S. Ser. No. 120,133, filed Nov. 13, 1987 entitled "Spectrometer Objective For Particle Beam Measuring Instruments", now U.S. Pat. No. 4,812,651, in which the inventors are Hans-Peter Feuerbaum and Juergen Frosien; U.S. Ser. No. 030,964, filed Mar. 27, 1987 entitled "Electrostatic-Magnetic Lens For Particle Beam Apparatus", now U.S. Pat. No. 4,785,176, in which the inventors are Juergen Frosien and Erich Plies; and U.S. Ser. No. 150,245 filed Jan. 29, 1988 entitled "Detector Objective For Scanning Microscopes", now U.S. Pat. No. 4,896,036, in which the inventors are Harold Rose and Joachim Zach.

BACKGROUND OF THE INVENTION

1. Field of the Invention

This invention relates to an improved objective lens for focusing charged particles.

2. Description of Related Art

There is an increasing need for high-resolution scanning electron microscopes in all areas of development and manufacture of micro-electronic and opto-electronic components so as to visually evaluate sub-micrometer structures, and to be able to identify deviations from standard patterns and to be able to acquire and evaluate topographical data such as heights, widths or angles of inclination. Conventional scanning electron microscopes, however, do not have the required resolution of a few nanometers unless very high accelerating voltages above about 20 kV are used which cause resist structures and integrated circuits to be damaged and non-conductive or high resistant specimens are charged which is a disadvantage.

SUMMARY OF THE INVENTION

It is an object of the invention to provide an objective lens for an electron microscope in which a charge-neutral examination of high resistant specimens can be made. The present invention has an electrostatic immersion lens which has first and second electrodes to which voltages are connected so that charged particles are decelerated in the field of the immersion lens to a low energy and has a third electrode to which a variable voltage can be applied to control and accelerate secondary particles.

The invention has the advantage that non-conductive or highly resistive specimens can be imaged and measured with high resolution in a charge-neutral manner.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
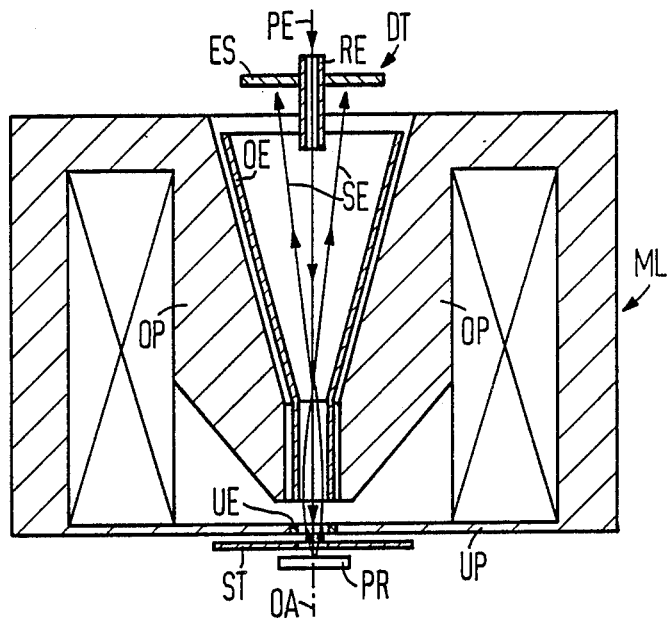
FIG. 1 is a sectional view illustrating the invention.

An objective lens is schematically shown in FIG. 1 which forms the component of a scanning electron microscope with which an electron source or the intermediate image which has been reduced in size by condenser lenses is imaged onto a specimen PR, which particularly may be an opto-electronic or micro-electronic component. The objective lens is formed of an asymmetrical magnetic lens ML, and of an electrostatic immersion lens OE/UE which is superimposed on the magnetic lens ML and a control electrode ST to which is supplied a variable potential and of a detector DT to detect the secondary electrons SE and back-scattered electrons which are triggered by the primary electrons PE at the respective measuring location.

The immersion lens comprises a conical electrode OE mounted in an insulated manner in the region of the upper pole piece OP of the magnetic lens ML and comprises a tube electrode UE which projects into the bore of the lower pole piece UP, their potentials $U_{OE}$ and, respectively, $U_{UE}$ are selected such that an electrical field which decelerates the primary electrons PE and, respectively, accelerates the secondary electrons SE is formed inside the objective lens. With a cathode potential of $U_K = -1$ kV and an anode potential of $U_A = +9$ kV, the primary electrons PE entering the lens with a high kinetic energy of, for example, $E_{PE} = 10$ keV are decelerated to the ultimate energy of, for example, $E_{PE} = 1$ keV when the electrode OE at the source side of the immersion lens is connected to the anode potential $U_{OE} = U_A = +9$ kV and the electrode UE is connected to ground $U_{UE} = 0$ V.

Due to the electrical retarding field which is superimposed on the focusing magnetic field, the objective lens of the invention has considerably better imaging properties than the magnetic lens ML ($U_{OE} = 0$ V) of the prior art. Thus, the chromatic aberration constant and the spherical aberration constant of the magnetic lens ML will exceed those of the electrostatic-magnetic objective lens of the invention by approximately one order of magnitude when the primary electrons PE are decelerated by roughly a factor 10 in the field of the immersion lens.

In the illustrated exemplary embodiment of FIG. 1, the detector DT for the secondary electron SE back-scattered electrons triggered at the respective measuring point and accelerated in the field of the immersion lens is arranged immediately above the magnetic lens ML as shown. The detector is formed of an annular, electron-sensitive portion ES and of a hollow cylinder RE which is held in a central opening and is insulated from the cylinder RE. In order to shield the primary electrons PE from the high voltage of, for example, $U_{ES} = 10$ kV that is usually applied to the annular portion ES, the hollow cylinder RE is charged with a positive potential $U_{RE}$ of, for example, $U_{OE} - 1$ kV $\lesssim U_{RE} \lesssim U_{OE}$. It also extends into the upper pole piece opening of the magnetic lens ML. Semiconductor detectors, channel plates or scintillator-light guide combinations may be used as detectors DT and may differ from the structure of FIG. 1 and can be arranged inside the objective lens. Annular detectors DT have the advantage that nearly all of the secondary electrons SE removed from the specimen PR in the field of the immersion lens can be recorded. Also, quadrant detectors can also be utilized.

The measuring and imaging of charge-neutral and of insulated specimens is assured in a scanning electron microscope when no charges are supplied to or removed from the respective measuring position. It is therefore desirable to at least approximately meet the condition:

$$i_{PR} = i_{PE} - (i_{RE} + i_{SE}) := 0$$

In this equation, $i_{PR}$ is the specimen current, $i_{PE}$ is the primary electron current, $i_{RE}$ is the current of the backscattered electrons, and $i_{SE}$ is the secondary electron current. Since, according to the equation $$i_{SE} = G(E_{PE}) \cdot i_{PE},$$

the secondary electron current $i_{SE}$ is determined by the primary electron current $i_{PE}$ and by the quantity G (G is usually referred to as the yield of emitted electrons) depending upon the primary electron energy $E_{PE}$, attempts are made in conventional scanning electron microscopes to compensate for the charge balance by an adaption of the beam energy $E_{PE}$ (modification of $i_{SE} \sim G(E_{PE})$) to the particular conditions (material of the measuring position, etc.). With a scanning electron microscope equipped with an objective lens of the invention, such a modification of the beam energy $E_{PE}$ and the disadvantages connected therewith (modification of the acceleration voltage, re-focusing of the primary electron beam, re-adjustment of the stigmator field) is not necessary, since the intensity of the secondary electron current $i_{SE}$ can be decreased or increased the required amount by using an electrode ST which is mounted under the magnetic lens ML so as to control the strength of the extraction field acting on the secondary electrons SE.

The potential $U_{ST}$ of the ring electrode or, diaphragm ST which defines the extraction field strength may be adjustable within a range from about $-100$ volts $\lesssim U_{ST} \lesssim 100$ volts when the beam energy $E_{PE}$ approximately corresponds to what is referred to as the neutral point energy $E_{NP}$ of the surface region being scanned. Since the neutral point energy $E_{NP}$ defined by the equation $G(E_{NP}) 1$ is usually only approximately known ($E_{NP}$ is also dependent on the topography of the measuring position, among other things), a somewhat larger range of adjustments of the potential $U_{ST}$ is required under certain circumstances.

In scanning electron microscopes which have conventional objective lenses, the resolution with low accelerating voltages below about 5 kV (with few exceptions, the neutral point energies lie in the energy range between about 0.5 and 4 keV) is limited by the Boersch effect and by the chromatic aberration of the objective lens. Due to the coulomb repulsion of the electrons, their spatial distance increases and, thus, the beam diameter on the specimen directly increases (lateral Boersch effect). Moreover, the electron-electron interaction in regions of high current densities, i.e., particularly in the beam generator and in the cross-over, results in a spread of the energy distribution of the primary electrons (energetic Boersch effect) and this has an unfavorable influence on the probe diameter due to the chromatic aberration of the objective lens. The diameter d of the primary beam on the specimen which defines the resolution can be approximately calculated from the equation:

$$d^2 = d_o^2 + d_F^2$$

wherein $d_{o\ l}$ *is the geometrical-optical beam diameter enlarged by the coulomb repulsion of the electrons between the beam generator and the specimen, and wherein $d_F$ is* the diameter of the circle of least confusion generated by the chromatic aberration of the objective lens. The quantity $d_F$ is defined by the equation:

$$d_F = 2 C_F \cdot \alpha \cdot (e\Delta U)/(eU)$$

in which $C_F$ is the chromatic aberration constant of the objective lens, d is the beam aperture, eU is the beam energy (U=accelerating voltage, e=elementary charge), and $e\Delta U$ is the width of the energy distribution of the primary electrons. So as to enhance the resolution of the scanning electron microscope for low beam energies, it is necessary to substantially reduce the influences of the energy and of the lateral Boersch effect. Since the influence of the lateral Boersch effect decreases with increasing kinetic energy eU but the width of the energy distribution noticeably increases, particularly in the beam generator, the primary electrons should traverse the source crossover with a low energy of, for example, $E_{PE} = 2$ keV (small relative energy width $e\Delta U/eU$) so as to subsequently accelerate them to a high energy of, for example, $E_{PE} = 10$ keV and so as to not decelerate them to the desired, low ultimate energy of, for example, $E_{PE} = 0.5$ through 2 keV until they are immediately above the specimen. The objective lens of the invention comprises a mean for decelerating and focusing the primary electrons, and the objective lens replaces the conventional objective lens of the scanning electron microscope which has a comparatively large aberration.

Figure 2:
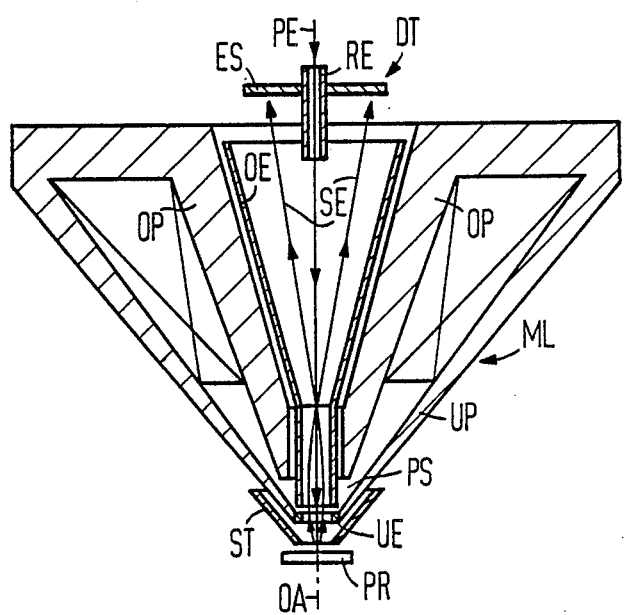
FIG. 2 is a sectional view of a modification of the invention.

So as to image and measure large-area specimens in a tilted condition in a short working distance, i.e., given a small focal length f, conventional scanning electron microscopes are usually equipped with conical objective lenses. Because of the shape of the pole shoe, however, this type of lens has a large pole piece gap PS and, thus, a comparatively long focal length f which causes large chromatic and spherical aberrations ($C_F \sim f$). A significant reduction in the aberrations of the objective lens can be achieved in the invention in that the conical magnetic lens ML is superimposed with the immersion lens shown in FIG. 1 which has a conical or, respectively, cylindrical electrode OE and a tube electrode UE arranged in the opening of the lower pole piece UP as shown in FIG. 2. The improvement in the imaging properties results from the reduction of the chromatic aberration constant and the spherical aberration constant resulting from the deceleration of the primary electrons PE but also results from the shift of the principal plane of the lens ML in the direction of the specimen PR (reduction of the focal length f). This has a favorable influence on the chromatic aberration constant $C_F$ which is proportional to the focal length f. The electrode ST for adjusting the strength of the extraction field which acts on the secondary electrons SE is also mounted directly under the magnetic lens ML and is preferably formed as a truncated cone in the exemplary embodiment illustrated in FIG. 2.

Figure 3:
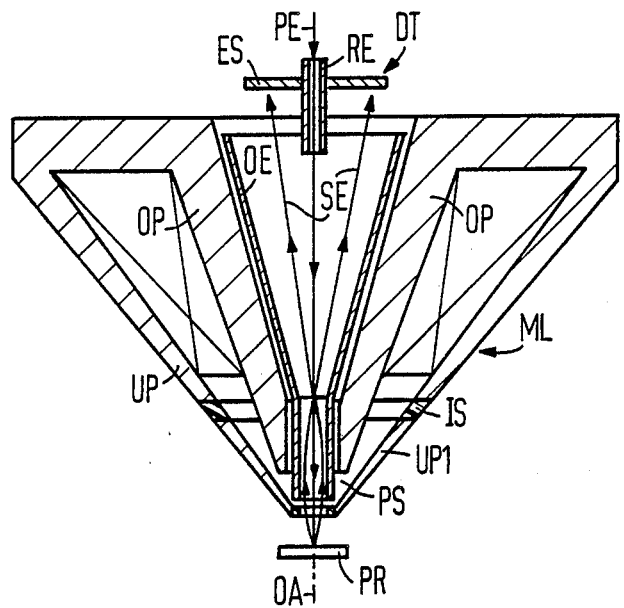
FIG. 3 is a sectional view of a further modification.

FIG. 3 illustrates that the electrode ST can also be integrated into the lower pole piece UP of the magnetic lens ML and the lower part UP1 can be separated from the upper pole piece portion by an insulator IS which is supplied the desired potential $U_{ST}$.

Figure 4:
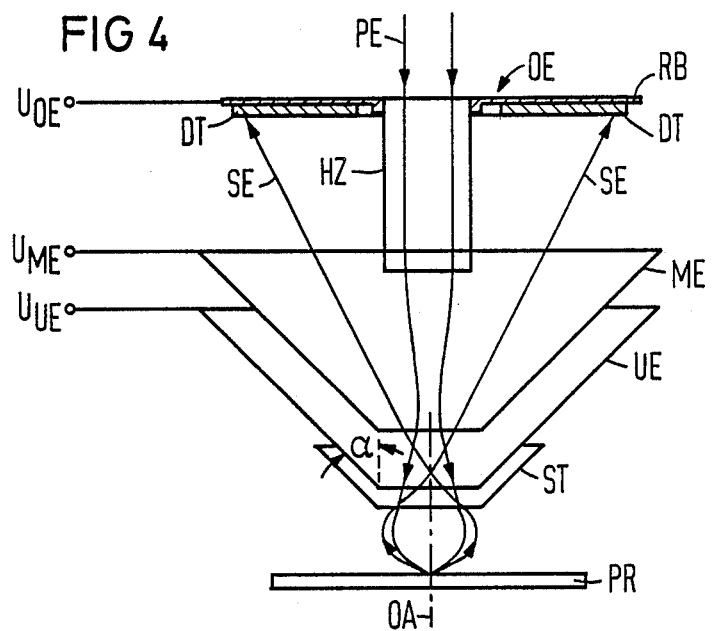
FIG. 4 illustrates another modification of the invention.

FIG. 4 shows a electrostatic objective lens (immersion lens with a middle electrode) which has a source-side electrode OE which comprises an annular part RB which acts as diaphragm and also comprises a hollow cylinder HZ which extends in the direction of the specimen PR. The middle electrode ME is connected to a variable, positive potential $U_{ME}$. The specimen-side electrode UE and the electrode ST for controlling the intensity of the secondary electron current emanating from the specimen PR are each formed as truncated cones in the exemplary embodiment shown and are arranged so as to be concentric to the axis OA of the hollow cylinder HZ. So as to measure and image the specimen PR which usually is at ground potential in its tilted condition, the lateral surfaces of the conical electrodes ME, UE and, respectively, ST should preferably form an angle $\alpha$ between about 30° and 70° with the axis OA. The detector DT for detecting the secondary electrons SE triggered at the specimen PR is mounted inside of the objective lens between the source-side electrode OE and the middle electrode ME. It is formed of an annular, electron-sensitive portion which is preferably constructed in a segmented manner. Since the hollow cylinder HZ has a somewhat lower potential $U_{HZ}$ than the middle electrode ME ($U_{HZ}$ $U_{ME}$), the secondary electrons SE emitted in the direction of the beam axis OA are also deflected to the detector DT and are detected. This lens also can be preferably used as objective in a high-resolution scanning electron microscope so as to decelerate the primary electrons PE which have been accelerated to high kinetic energies to the desired final desired energies. The electrode OE, for example, is supplied with the potential of the anode of the beam generator, and the electrode UE is at the potential of the specimen PR, i.e. which usually is at ground potential. The potential $U_{ME}$ of the middle electrode ME should be variable over a range from about $U_{ME}=1.1\ U_{OE}$ through $2.5\ U_{OE}$.

The invention, of course, is not limited to the described exemplary embodiments. Thus, it is possible to replace the conical electrode OE with a tube electrode. Care should be exercised, however, to assure that the tube diameter is greater than the maximum cross section of the divergent secondary electron beam which is generated within the objective lens.

Instead of the electrode UE, the lower pole piece can also serve as the second electrode of the immersion lens.

A significant improvement in the resolution of a scanning electron microscope is to be particularly anticipated when the energy of the primary electrons is reduced by at least a factor of two using the objective lens of the invention.

Although the invention has been described with respect to preferred embodiments as changes and modifications will become apparent from the appended claims.

I claim as my invention:

1. An objective lens for focusing charged particles on a specimen comprising, an electrostatic immersion lens which has a first electrode (OE) and a second electrode (UE) which are connected to potentials ($U_{OE}$, $U_{UE}$) so that the charged particles (PE) are decelerated in the field of the immersion lens from a first to a lower, second energy, a third electrode (ST) which is connected to a variable potential ($U_{ST}$) so as to control the intensity of the current of secondary particles (SE) emanating from said specimen (PR) and which are accelerated in a direction toward a detector (DT).

2. An objective lens according to claim 1, wherein said third electrode (ST) is mounted between said immersion lens (OE/UE) and said specimen (PR).

3. An objective lens according to claim 1 or 2, wherein said immersion lens (OE/UE) is formed so as to be superimposed with a magnetic lens (ML).

4. An objective lens according to claim 3, wherein said third electrode (ST) is mounted in an opening of the lower pole piece (UP) of said magnetic lens (ML).

5. An objective lens according to claim 3, wherein said third electrode (ST) is mounted in an opening of the lower pole piece (UP) of said magnetic lens (ML).

6. An objective lens according to claim 1 or 2, wherein said immersion lens comprises a middle electrode (ME) and said middle electrode (ME) and said second electrode (UE) of the immersion lens are conical-shaped and said third electrode (ST) is conical-shaped and is arranged immediately under said second electrode (UE).

7. An objective lens according to claim 3, wherein said first electrode (OE) is mounted in an opening of the upper pole piece (OP) of said magnetic lens (ML); and said second electrode (UE) is mounted in an opening of the lower pole piece (UP).

8. An objective lens according to claim 7, wherein said second electrode (UE) is formed by the lower pole piece (UP) of the magnetic lens (ML).

* * * * *